(12) United States Patent
Zhu et al.

(10) Patent No.: US 7,883,944 B2
(45) Date of Patent: Feb. 8, 2011

(54) ULTRA-THIN SEMICONDUCTOR ON INSULATOR METAL GATE COMPLEMENTARY FIELD EFFECT TRANSISTOR WITH METAL GATE AND METHOD OF FORMING THEREOF

(75) Inventors: Huilong Zhu, Poughkeepsie, NY (US); Bruce B. Doris, Brewster, NY (US); Philip J. Oldiges, Langrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 135 days.

(21) Appl. No.: 12/407,001

(22) Filed: Mar. 19, 2009

(65) Prior Publication Data

US 2010/0237410 A1 Sep. 23, 2010

(51) Int. Cl.
*H01L 21/84* (2006.01)
(52) U.S. Cl. .............................. 438/151; 257/E21.561; 438/300
(58) Field of Classification Search ......... 438/151–166, 438/300; 257/E21.561
See application file for complete search history.

(56) References Cited

U.S. PATENT DOCUMENTS

| 6,391,728 | B1 | 5/2002 | Yu | |
| 6,437,406 | B1 | 8/2002 | Lee | |
| 6,509,241 | B2 | 1/2003 | Park et al. | |
| 6,787,424 | B1 * | 9/2004 | Yu | 438/300 |
| 6,939,751 | B2 * | 9/2005 | Zhu et al. | 438/151 |
| 7,091,069 | B2 | 8/2006 | Doris et al. | |
| 2002/0056873 | A1 | 5/2002 | Wann | |
| 2002/0142551 | A1 * | 10/2002 | Park et al. | 438/300 |
| 2002/0197810 | A1 * | 12/2002 | Hanafi et al. | 438/330 |
| 2005/0090066 | A1 * | 4/2005 | Zhu et al. | 438/300 |
| 2005/0093075 | A1 * | 5/2005 | Bentum et al. | 257/368 |

* cited by examiner

*Primary Examiner*—Richard A. Booth
(74) *Attorney, Agent, or Firm*—Scully, Scott, Murphy & Presser, P.C.; H. Daniel Schnurmann

(57) ABSTRACT

A method of forming a semiconductor device is provided that may include providing a semiconductor layer including a raised source and raised drain region that are separated by a recessed channel having a thickness of less than 20 nm, and forming a spacer on a sidewall of the raised source and drain region overlying a portion of the recessed channel. In a following process step, a channel implantation is performed that produces a dopant spike of opposite conductivity as the raised source and drain regions. Thereafter, the offset spacer is removed, and gate structure including a metal gate conductor is formed overlying the recessed channel.

13 Claims, 5 Drawing Sheets

ULTRA-THIN SEMICONDUCTOR ON INSULATOR METAL GATE COMPLEMENTARY FIELD EFFECT TRANSISTOR WITH METAL GATE AND METHOD OF FORMING THEREOF

FIELD OF INVENTION

The present disclosure relates to semiconductor devices and methods of manufacture. In one embodiment, the present invention relates to a method for manufacturing an improved metal oxide semiconductor (MOS) transistor having a thin channel region.

BACKGROUND OF THE INVENTION

Field effect transistors (FETs) are the basic building block of today's integrated circuits (ICs). Such transistors can be formed in bulk semiconductor substrates (such as silicon) or in the SOI layer of a semiconductor-on-insulator (SOI) substrate. In order to be able to make ICs, such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device, while maintaining the device's electrical properties.

SUMMARY OF THE INVENTION

A method of forming a semiconductor device is provided that includes providing a semiconductor layer including a raised source and a raised drain that are separated by a recessed channel having a thickness of less than 20 nm; forming an offset spacer abutting a sidewall of the raised source and the raised drain that is atop a portion of the recessed channel; performing a channel implant that produces a dopant spike of opposite conductivity as the raised source and the raised drain; removing the offset spacer; and forming a gate structure including a metal gate conductor on top of the recessed channel.

In another aspect, a semiconductor device is provided that may include a semiconducting layer including a recessed channel, a raised source, and a raised drain, wherein the raised source and the raised drain are of a first conductivity type and are on opposing sides of the recessed channel, and wherein the recessed channel is substantially depleted of charge carriers; a channel implant region having a peak concentration present substantially at a center of the recessed channel, wherein a concentration of the channel implant region decreases from the peak concentration towards each end of the recessed channel that abuts the raised source and the raised drain; and a gate structure including a metal gate conductor overlying the recessed channel.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

Figure 1:
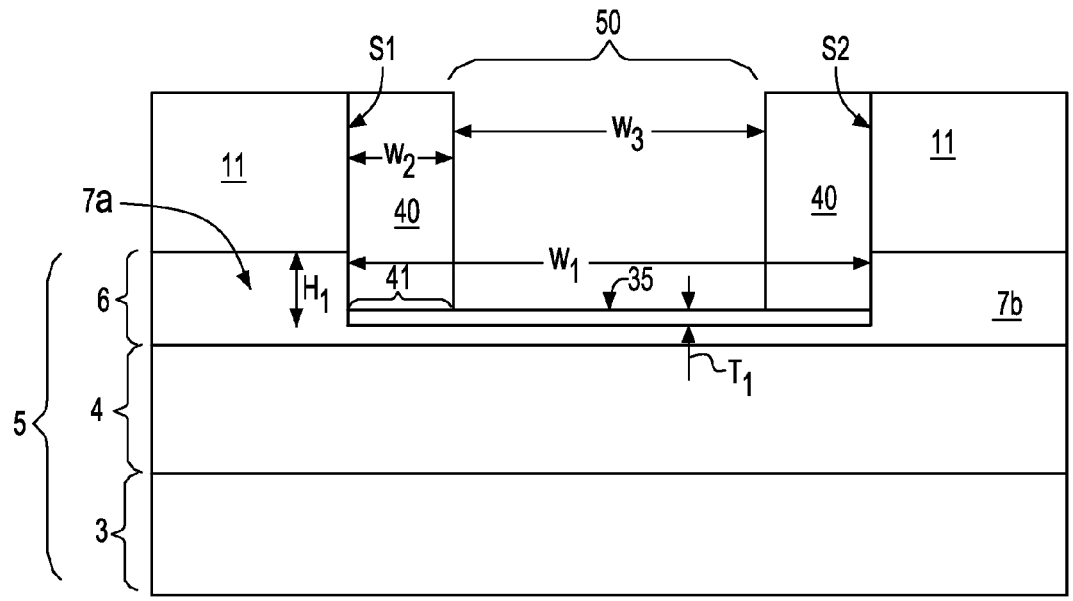
FIG. 1 is a side cross-sectional view depicting an initial structure produced using the initial processing steps of a method that in one embodiment includes providing a semiconductor layer including a raised source and a raised drain that are separated by a recessed channel having a thickness of less than 20 nm.

The above drawings represent some embodiments of the present invention, which are provided for illustrative purposes only are not intended to limit the scope of the invention solely thereto.

DETAILED DESCRIPTION

The present invention will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention. When describing the methods and structures of the present invention, the following terms have the following meanings, unless otherwise indicated.

As used herein, "semiconductor device" refers to an intrinsic semiconductor material that has been doped, that is, into which a doping agent has been introduced, giving it different electrical properties than the intrinsic semiconductor. Doping means adding dopant atoms to an intrinsic semiconductor, which changes the electron and hole carrier concentrations of the intrinsic semiconductor at thermal equilibrium. Dominant carrier concentrations in an extrinsic semiconductor classify it as either an n-type or p-type semiconductor.

As used herein, the terms "conductivity type" and "conductivity region" denote a p-type or n-type doped semiconductor.

As used herein, "p-type" refers to the addition of impurities to an intrinsic semiconductor that creates deficiencies of valence electrons. In one example, in which the intrinsic semiconductor is a type IV semiconductor, such as silicon, the addition of boron, aluminum, or gallium to the semiconductor produces a p-type conductivity region.

As used herein, "n-type" refers to the addition of impurities to an intrinsic semiconductor that contribute free elections. In one example, in which the intrinsic semiconductor is a type IV semiconductor, such as silicon, the addition of antimony, arsenic, or phosphorous to the semiconductor produces an n-type conductivity region.

As used herein a "field effect transistor (FET)" is a transistor in which output current, i.e., source-drain current, is controlled by the voltage applied to the gate. A field effect transistor has three terminals, i.e., a gate, a source and a drain.

As used herein, the term "drain" means a doped region in semiconductor substrates located at the end of the channel in field effect transistors (FET), in which carriers are flowing out of the device through the drain.

As used herein, the term "source" is a doped region of a semiconductor device from which majority carriers are flowing into the channel.

As used herein, the term "channel" is the region between the source and drain of a semiconductor device that becomes conductive when the transistor is turned on.

"Raised" and "recessed" as used to describe the geometric relationship of two structures denotes that the two structures are vertically offset. For example, a raised source and a raised drain when used in context with a recessed channel denotes that an upper surface of the raised source and raised drain is vertically offset from the upper surface of the recessed channel.

A "gate structure" means a structure used to control output current (i.e., flow of carriers in the channel) of a semiconducting device, such as a field effect transistor (FET).

As used herein, the term "gate conductor" denotes a material having a bulk resistivity ranging from $10^{-4}$ $\Omega$-cm to $10^{-6}$ $\Omega$-cm, which is positioned overlying a gate dielectric.

As used herein, a "pFET" refers to a field effect transistor having source/drain regions created by the addition of impurities that create deficiencies of valence electrons to an intrinsic semiconductor.

As used herein, an "nFET" refers to a field effect transistor having source/drain regions created by created the addition of impurities that contribute free electrons to an intrinsic semiconductor.

As used herein, a "metal" is an electrically conductive material, wherein metals atoms are held together by the force of a metallic bond; and the energy band structure of the metal's conduction and valence bands overlap, and hence, there is no energy gap.

As used herein, a "gate dielectric" is a layer of dielectric between the semiconductor device substrate and the gate conductor.

As used herein, the term "dielectric" denote a non-metallic material having insulating properties.

As used herein, "insulating" denotes a room temperature conductivity of less than about $10^{-10}(\Omega\text{-m})^{-1}$.

As used herein, "high-k" denotes a dielectric material featuring a dielectric constant (k) higher than 3.9.

The term "threshold voltage" is the voltage required to switch a semiconductor device from an off state to an on state.

"Peak concentration" and "dopant spike" as used to defined a dopant region mean the portion of the substrate that contains the greatest dopant concentration of a particularly dopant type. Portions of the substrate adjacent the portion of the substrate having the peak concentration and containing the same dopant type will have a lower dopant concentration than the peak concentration for that particular dopant.

"Implant" means the introduction of a dopant into a semiconductor material.

For purposes of the description hereinafter, the terms "upper", "lower", "right", "left", "vertical", "horizontal", "top", "bottom", and derivatives thereof shall relate to the invention, as it is oriented in the drawing figures.

Further, it will be understood that when an element as a layer, region or substrate is referred to as being "atop" or "over" or "overlying" or "below" or "underlying" or "abutting" another element, it can be directly on the other element or intervening elements may also be present. In contrast, when an element is referred to as being "directly on" or "directly over" or in "direct physical contact" with another element, there are no intervening elements present.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 2:
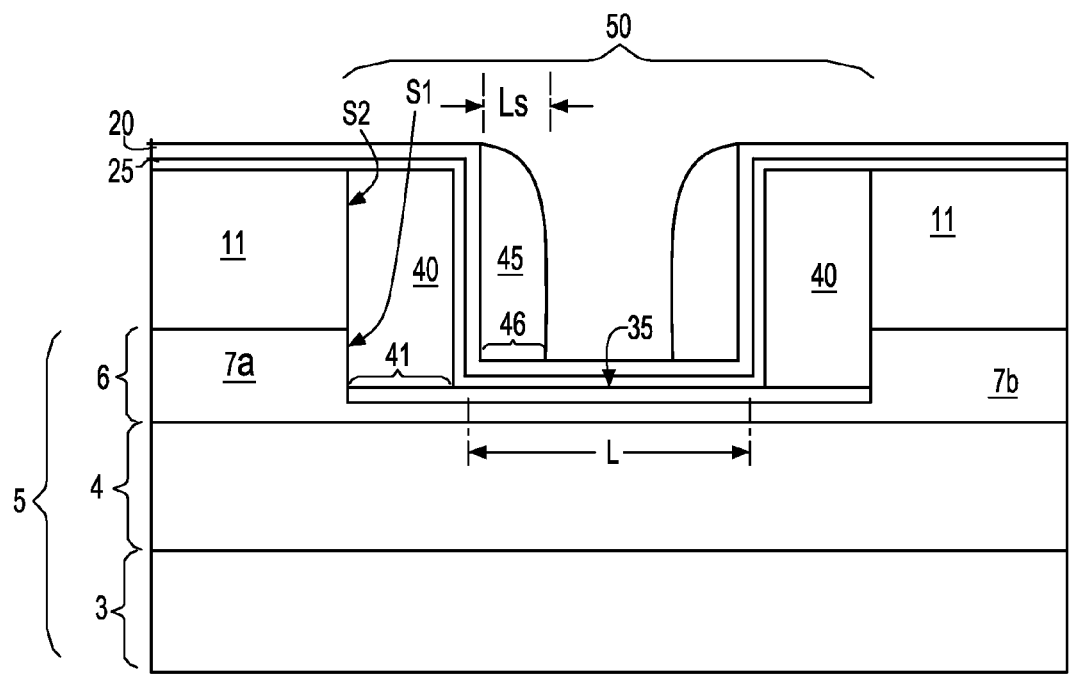
FIG. 2 is a side cross-sectional view depicting a process sequence that includes forming an offset spacer abutting a sidewall of the raised source and the raised drain that is depicted in FIG. 1, wherein the offset spacer is present overlying a portion of the recessed channel.
Figure 3:
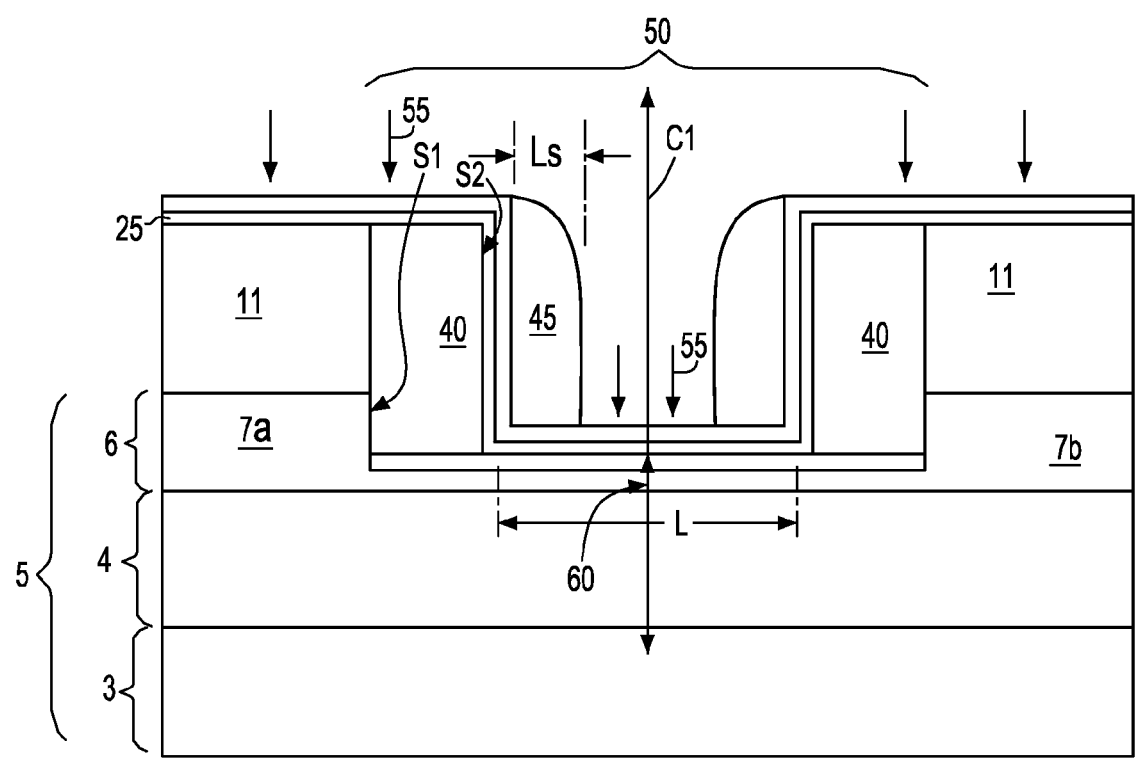
FIG. 3 is a side cross-sectional view depicting performing a channel implant to the structure depicted in FIG. 2, wherein the dopant of the channel implant produces a dopant spike of opposite conductivity as the raised source and the raised drain.

FIGS. 1-5 depict one embodiment of a method of forming a semiconductor device 100, in which a channel implant 55 having a peak concentration, i.e., dopant spike 60, at the center $C_1$ of a recessed channel 50 may reduce short channel effects and may enhance controllability of the semiconductor device 100. The method may begin with providing a semiconductor layer 6 including a raised source 7a and raised drain 7b that are separated by a recessed channel 50 having a thickness $T_1$ of less than 20 nm. In a following process step, an offset spacer 45 is formed abutting a sidewall $S_1$ of the raised source 7a and the raised drain 7b that is overlying a portion 46 of the recessed channel 50. It is noted that although FIGS. 2 and 3 depict where the offset spacer 45 is formed in direct physical contact with dielectric layers, i.e., a second dielectric layer 25 and a third dielectric layer 20, that are present on the sidewalls of a sidewall spacer 40, which is directly on the sidewalls S1 of the raised source 7a and raised drain 7b, embodiments of the present invention have been contemplated in which the sidewall spacer 40, the second dielectric layer 25 and the third dielectric layer 20 are not present between the offset spacer 45 and the sidewall $S_1$ of the raised source 7a and the raised drain 7b. Following the formation of the offset spacer 45, a channel implant 55 is performed that produces a dopant spike 60 of opposite conductivity as the raised source 7a and raised drain 7b. Thereafter, the offset spacer 45 is removed from the sidewall $S_1$ of the raised source 7a and raised drain 7b, and a gate structure 65 is formed including a metal gate conductor 66 overlying the recessed channel 50. The details of this method and the structures included therein are now described in greater detail.

FIG. 1 depicts an initial structure that may be used in some embodiments of the inventive method. The initial structure may include a semiconductor layer 6 having a raised source 7a and a raised drain 7b that are separated by a recessed channel 50 having a thickness $T_1$ of less than 20 nm. In one embodiment, the semiconductor layer 6 is provided by a semiconductor on insulator (SOI) layer of a semiconductor on insulator (SOI) substrate 5. In one embodiment, etching a portion of the SOI layer recesses the upper surface of the SOI layer being etched relative to the upper surface of the SOI layer that is not being etched. In this instance, the recessed channel 50 is present in the etched portion of the SOI layer and the raised source 7a and the raised drain 7b are present in the portion of the SOI layer that is not etched.

The SOI substrate 5 typically includes a top semiconductor layer that may interchangeably be referred to as an SOI layer and is hereafter referred to as a semiconductor layer 6, i.e., upper semiconductor layer, a buried insulating layer 4, and a lower semiconductor layer 3. In one embodiment, the SOI substrate 5 may be formed by a thermal bonding process, or alternatively, the SOI structure 5 may be formed by an oxygen implantation process, which is referred to in the art as a separation by implantation of oxygen (SIMOX). The semiconductor layer 6 may be composed of a Si-containing material. The term "Si-containing material" as used herein denotes any semiconductor material that includes silicon. Illustrative examples of various Si semiconductor materials that can be employed in the present invention include, but are not limited to: Si, SiGe, SiGeC, SiC and other like Si-containing materials. Combinations of the aforementioned semiconductor materials can also be used as the semiconductor layer 6 of the SOI substrate 5. The semiconductor layer 6 may have an initial thickness ranging from 20.0 nm to 70.0 nm. The buried insulating layer 4 is typically a buried oxide region, which may have a thickness ranging from 150.0 nm to 200.0 nm. Similar to the semiconductor layer 6, the lower semiconductor layer 3 may be composed as a Si-containing material.

In one embodiment, a pad dielectric 11 is formed atop the SOI substrate 5. The pad dielectric 11 may comprise an oxide material. In one example, in which the pad dielectric 11 is composed of an oxide material, the pad dielectric 11 may be formed by thermal oxidation or by a deposition processes, such as, for example, chemical vapor deposition, room temperature chemical vapor deposition, plasma enhanced chemical vapor deposition, or chemical solution deposition. The pad dielectric 11 may have a thickness ranging from 50.0 nm to 150.0 nm. It is noted that the pad dielectric 11 may also be composed of other dielectric materials, such as nitride and oxynitride materials. Further, multi-layered structures are contemplated for the pad dielectric 11.

Following the formation of the pad dielectric 11, an etch process is typically performed to recess the upper surface of a portion of the semiconductor layer 6 that provides the recessed channel 50, in which the remaining portions of the semiconductor layer 6 that have not been recessed provide the raised source 7a and the raised drain 7b. The raised source 7a and the raised drain 7b may have a thickness ranging from 10 nm to 50 nm. In one embodiment, the etch process may be performed utilizing a dry etching process, such as reactive-ion etching, ion beam etching, laser ablation or any combination thereof. The etch process used may also be an anisotropic etch. As used herein, an "anisotropic etch process" denotes a material removal process in which the etch rate in the direction normal to the surface to be etched is much higher than in the direction parallel to the surface to be etched.

In one embodiment, prior to the etch process, an etch mask (not shown) is formed overlying the pad dielectric 11, wherein the etch mask exposes the portion of the pad dielectric 11 that is overlying the portion of the semiconductor layer 6 in which the recessed channel 50 is formed. The etch mask may be formed using deposition, photolithography and etch processes. More specifically, an etch mask is produced by applying a photoresist layer to the surface to be etched; exposing the photoresist layer to a pattern of radiation, and then developing the pattern into the photoresist utilizing a resist developer.

Following the formation of the etch mask, the upper surface of the semiconductor layer 6 underlying the exposed portion of the pad dielectric 11 is recessed. In one embodiment, the portion of the semiconductor layer 6 that provides the recessed channel 50 is thinned by an etch process to a thickness $T_1$ of 20 nm or less, e.g., ranging from 5 nm to 20 nm. In another embodiment, the recessed channel 50 is thinned to a thickness $T_1$ within the range of 5 nm to 15 nm. In a further embodiment, the recessed channel 50 is thinned to a thickness $T_1$ within the range of 2 nm to 5 nm. It is noted that other thicknesses for the recessed channel 50 are also contemplated, so long as the thickness of the recessed channel 50 provides for a channel that may be fully depleted of charge carriers when the semiconductor device is in the "off" state. "Fully depleted of charge carriers" as used herein means that the concentration of charge carriers present at 300K in the recessed channel 50 is on the order of $10^3$ atoms/cm$^3$ or less.

In one example, the etch process to provide the recessed channel region 50 utilizes a single etch chemistry that removes the material of the pad dielectric 11 and the semiconductor layer 6 selective to the etch mask. The etch process may be timed to provide the desired thickness $T_1$ for the recessed channel region 50. The etch mask may be removed using an $O_2$ ash process. Alternatively, the etch mask may be stripped using a wet chemical process.

In another example, the etch process to provide the recessed channel 50 utilizes a multi-stage etch process that includes a first etch chemistry that removes the exposed portion of the pad dielectric 11 selective to the semiconductor layer 6. Thereafter, the etch mask may be removed. In this instance, the remaining portion of the pad dielectric 11 functions as an etch mask to recess the upper surface, i.e., exposed upper surface, of the semiconductor layer 6. A second etch chemistry then recesses the exposed upper surface of the semiconductor layer 6 selective to the remaining portion of the pad dielectric 11. In such an instance, the second etch chemistry may be a timed process to provide the desired thickness $T_1$ for the recessed channel 50.

Following, the above described etch process of the semiconductor layer 6, a raised source 7a and raised drain 7b is provided, in which the upper surface of the raised source 7a and the raised drain 7b is vertically offset from the upper surface of the recessed channel 50 by a dimension $H_1$ ranging from 10 nm to 50 nm. In another embodiment, the upper surface of the raised source 7a and the raised drain 7b is vertically offset from the upper surface of the recessed channel 50 by a dimension $H_1$ ranging from 20 nm to 30 nm. The raised source 7a and the raised drain 7b can be separated by a dimension $W_1$ ranging from 40 nm to 90 nm, wherein the distance separating the raised source 7a from the raised drain 7b may be referred to as the length of the recessed channel 50. In one embodiment, the raised source 7a and the raised drain 7b are typically separated by a dimension $W_1$ ranging from 30 nm to 70 nm. In another embodiment, the raised source 7a and the raised drain 7b are separated by a dimension $W_1$ ranging from 50 nm to 60 nm.

The raised source 7a and 7b may be doped using a variety of methods. In some embodiments of the invention, the raised source 7a and raised drain 7b may have been doped, e.g., implanted into the semiconductor layer 6 prior to the formation of the pad dielectric 11, in which the dopant corresponds to the desired conductivity type of the semiconductor device 100 that is produced by the present method. In other embodiments, dopants to the raised source 7a and raised drain 7b are introduced via implantation in following processing steps that will be described in greater detail below.

Still referring to FIG. 1, a first dielectric layer 35 is formed overlying the recessed channel 50. The first dielectric layer 35 is one of the dielectric layers that provides the gate dielectric of the semiconductor device. The first dielectric layer 35 may be composed of an oxide, nitride, or oxynitride material. High-k dielectric materials, such as Hf containing oxides, have also been contemplated for the first dielectric layer 35. The first dielectric layer 35 may be formed using deposition, such as chemical vapor deposition, e.g., plasma enhanced chemical vapor deposition, or growth processes, such as thermal growth, e.g., thermal oxidation. The first dielectric layer 35 typically has a thickness of less than 10 nm, wherein in some examples the first dielectric layer 35 has a thickness ranging from 2 nm to 5 nm. In one embodiment, the first dielectric layer 35 is an oxide, such as silicon oxide, that has been formed using thermal oxidation to a thickness that ranges from 2 nm to 5 nm.

In a following process sequence, a sidewall spacer 40 is formed overlying a portion 41 of the first dielectric layer 35 and in direct physical contact with the sidewall $S_1$ of the raised source 7a and the raised drain 7b, as well as being in direct physical contact with the sidewall $S_2$ of the pad dielectric 11. The sidewall spacer 40 may be composed of any dielectric material including, but not limited to oxides, nitrides and oxynitrides. The sidewall spacer 40 typically has a width $W_2$ ranging from 10 nm to 25 nm, with a width $W_2$ ranging from 15 nm to 20 nm being more typical. The sidewall spacers 40 are typically formed using deposition and etch process. In one embodiment, the sidewall spacers 40 are composed of a nitride, such as silicon nitride, having a width $W_2$ on the order of 15 nm.

The sidewall spacer 40 that is present in direct physical contact with the raised source 7a may be separated from the sidewall spacer 40 that is in direct physical contact with the raised drain 7b by a dimension $W_3$ that typically ranges from 10 nm to 40 nm, with the dimension $W_3$ from 20 nm to 30 nm being more typical. In one embodiment, the sidewall spacers 40 are planarized to have an upper surface coplanar with the upper surface of the pad dielectric 11.

FIG. 2 depicts a process sequence that includes forming an offset spacer 45 abutting a sidewall $S_1$ of the raised source 7a and the raised drain 7b, wherein the offset spacer 45 is present overlying a portion 46 of the recessed channel 50. In one embodiment, in which the first dielectric layer 35 and the offset spacer 45 are composed of a first dielectric material and the sidewall spacer 40 is composed of a second dielectric material, forming the offset spacer 45 abutting the sidewall $S_1$ of the raised source 7a and raised drain 7b includes forming a second dielectric layer 25 composed of the first dielectric material overlying the sidewall spacer 40 and the first dielectric layer 35, forming a third dielectric layer 20 composed of the second dielectric material overlying the second dielectric layer 25, and forming the offset spacer 45 abutting the vertical surfaces of the third dielectric layer 20 that is abutting a sidewall $S_2$ of the sidewall spacer 40, wherein a central portion of the third dielectric layer 40 that is not underlying the offset spacer is exposed. For the purposes of describing the relationship of the offset spacer 45 to the sidewall of the raised source 7a and the raised drain 7b, the term abutting means that the offset spacer 45 can be directly on the sidewall of the raised source 7a and raised drain 7b, or intervening elements may also be present. In the embodiments, in which the offset spacer 45 is directly on the sidewall of the raised source 7a and raised drain 7b, the sidewall spacer 40 and the vertical portions of the second dielectric layer 25 and the third dielectric layer 20 may be omitted.

In one embodiment, the first dielectric material as utilized in the first dielectric layer 35 and the offset spacer 45 is composed of an oxide, such as silicon oxide, and the second dielectric material as utilized in the third dielectric layer 20 and the sidewall spacers 40 is composed of a nitride, such as silicon nitride. It is noted that other dielectric materials are also contemplated for the first dielectric material and the second dielectric material, so long as the materials selected for the first dielectric material and the second dielectric material provide etch selectivity during the process sequence described below.

The second dielectric layer 25 is typically a conformal layer formed using a deposition technique. The term "conformal layer" denotes a layer having a thickness that does not deviate from greater than or less than 20% of an average value for the thickness of the layer.

The second dielectric layer 25 that is formed atop the upper surface of the pad dielectric 11, on the sidewall spacer 40, and the upper surface of the first dielectric layer 35 may be an oxide material, and may have a thickness ranging from 2.5 nm to 5.0 nm thick. The second dielectric layer 25 may be formed using deposition techniques, such as chemical vapor deposition (CVD), atomic layer CVD (ALCVD), pulsed CVD, plasma of photo assisted CVD, sputtering, and chemical solution deposition, or alternatively, the second dielectric layer 25 is formed by thermal growing process, which may include oxidation, oxynitridation, nitridation, and/or plasma or radical treatment. Suitable examples of oxides that can be employed as second dielectric layer 25 include, but are not limited to $SiO_2$, $Al_2O_3$, $ZrO_2$, $HfO_2$, $Ta_2O_3$, $TiO_2$, perovskite-type oxides and combinations and multi-layers thereof. It is noted that the second dielectric layer 25 may also be composed of a high-k dielectric material, wherein high-k dielectric materials have a dielectric constant of 3.9 or greater, typically on the order of 4.0, and in some instances greater than 7.0.

In one embodiment of the present invention, the channel length L of the device formed by the method disclosed in FIGS. 1-5 is equal to a dimension separating a portion of the second dielectric layer 25 that is present on the sidewall $S_1$ of the sidewall spacer 40 from an opposing portion of the second dielectric layer 25 that is present on an opposing sidewall $S_1$ of the sidewall spacer 40. The thickness of the second dielectric layer 25 may be selected to provide a channel length L ranging from 5 nm to 15 nm, with a channel length L ranging from 5 nm to 10 nm being more typical. In another example, the thickness of the second dielectric layer 25 is selected to provide a channel length L ranging from 15 nm to 35 nm.

The third dielectric layer 20, typically being composed of a nitride, such as silicon nitride, is then deposited atop the second dielectric layer 25 using a deposition process, including, but not limited to: chemical vapor deposition, low pressure chemical vapor deposition, and plasma enhanced deposition. Similar to the second dielectric layer 25, the third dielectric layer 20 is composed of a conformal dielectric layer. The third dielectric layer 20 may also be grown using a growth process, such as thermal nitridation. The thickness of the third dielectric layer 20 is typically from about 5.0 nm to about 60.0 nm.

In a following process step, the offset spacer 45 is formed in direct physical contact with an upper surface portion 46 of the third dielectric layer 20 and in direct physical contact with a portion of the third dielectric layer 20 that is abutting the sidewall $S_1$ of the sidewall spacer 40. The offset spacer 45 may be composed of any dielectric material including, but not limited to oxides, nitrides and oxynitrides. The offset spacer 45 typically has a width $L_s$ ranging from about 5 nm to about 20 nm, with a width $L_s$ ranging from about 5 nm to about 15 nm being more typical. The offset spacer 45 is typically formed using deposition and etch process. In one embodiment, the offset spacer 45 is composed of an oxide, such as silicon oxide, having a width $L_s$ on the order of 10 nm.

Figure 4:
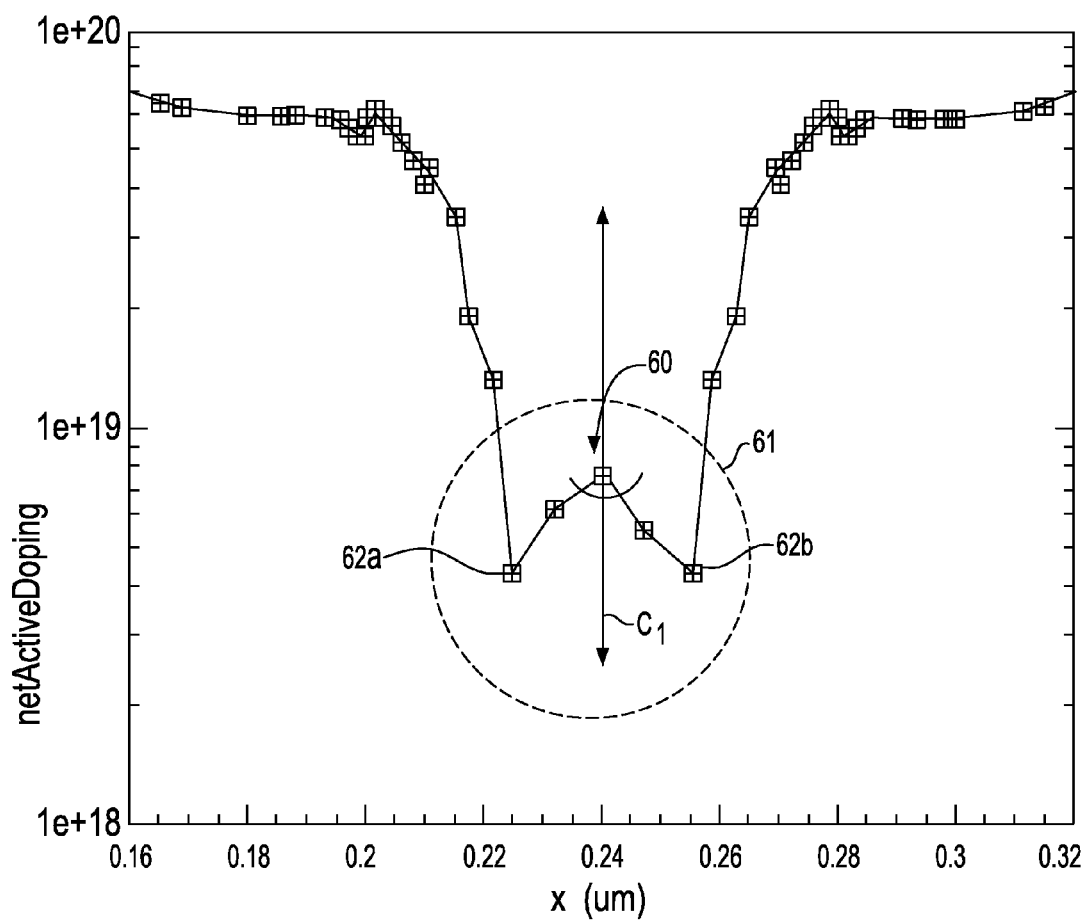
FIG. 4 is a plot of one embodiment of a dopant profile in the recessed channel of an nFET device produced by a channel implant that is consistent with the process sequence depicted in FIG. 3.

FIGS. 3 and 4 depict one embodiment of performing a channel implant 55 to the structure depicted in FIG. 2, wherein the dopant of the channel implant 55 produces a dopant spike 60 of opposite conductivity as the raised source 7a and the raised drain 7b. In one example, the implant dose for the channel implant 55 is correlated to a ration provided by the channel length L minus twice the width ($L_s$) of the offset spacer 45 divided by the channel length (L): $(L-2L_s)/L$. In one example, as L becomes closer in dimension to $2L_s$, and $(L-2L_s)/L$, approaches a value of zero or less, the dose that is received in the channel area decreases. More particularly, the smaller the dimension of the channel length (L) the smaller the value for the implant dose of the channel implant 55. Using the above described ratio and taking into account the desired dopant concentration for the channel, the dose for the channel implant 55 may be calculated.

Referring to FIG. 3, in one embodiment, in which the method provides an nFET device, the channel implant 55 may produce an dopant concentration of a p-type dopant, e.g., boron, indium, aluminum, or gallium, having a concentration of $4 \times 10^{16}$ atoms/cm$^3$ or greater, with a concentration from $2 \times 10^{17}$ atoms/cm$^3$ to $2 \times 10^{18}$ atoms/cm$^3$ being more typical. In this embodiment, the channel implant 55 may be carried out in an ion implant apparatus that operates at an energy that ranges from 0.5 keV to 60.0 keV. In another example, the channel implant 55 is carried out using an energy of from 0.5 keV to 10.0 keV. In the embodiments, in which the method provides an nFET device, the channel implant 55 may be carried out at a temperature from 800° C. to 1100° C. with a temperature from 900° C. to 1050° C. being more typical.

In one embodiment, in which the method provides an pFET device, the channel implant 55 may produce an implant composed of n-type dopant, e.g., antimony, arsenic, or phosphorous, having a concentration of $4 \times 10^{16}$ atoms/cm$^3$ or greater, with a concentration from $2 \times 10^{17}$ atoms/cm$^3$ to $2 \times 10^{18}$ atoms/cm$^3$ being more typical. In this embodiment, the channel implant 55 may be carried out in an ion implant apparatus that operates at an energy from 0.5 keV to 60.0 keV. In another example, the channel implant 55 is carried out using an energy of from 0.5 keV to 10.0 keV. In the embodiments, in which the method provides an pFET device, the channel implant 55 may be carried out at a temperature from 800° C. to 1100° C. with a temperature from 900° C. to 1050° C. being more typical.

The channel implant 55 typically produces a dopant spike 60 of opposite conductivity as the raised source 7a and the raised drain 7b that is present at the center $C_1$ of the channel length L. The term "substantially" as used to describe the location of the peak concentration, i.e., the dopant spike 60 that is produced by the channel implant 55, which is present substantially at the center C1 of the recessed channel 50, i.e., substantially the center of the channel length L, means that the dopant spike 60 may deviate by a lateral dimension having a value as great as 20% of the channel length L from the center C1 of the recessed channel 50. The center C1 of the recessed channel 50 being equidistant from the raised source 7a and the raised drain 7b. In one embodiment, in which the dopant spike 60 is composed of a p-type dopant, the concentration of the dopant spike 60 may range from $1 \times 10^{17}$ atoms/cm$^3$ to $1 \times 10^{19}$ atoms/cm$^3$, wherein in one example the dopant spike 60 may range from $2 \times 10^{17}$ atoms/cm$^3$ to $7 \times 10^{18}$ atoms/cm$^3$, and in a further example the dopant 60 spike may range from $1 \times 10^{18}$ atoms/cm$^3$ to $5 \times 10^{18}$ atoms/cm$^3$. In another embodiment, in which the dopant spike 60 is composed of a n-type dopant, the concentration of the dopant spike 60 may range from $1 \times 10^{17}$ atoms/cm$^3$ to $1 \times 10^{19}$ atoms/cm$^3$, wherein in one example the dopant spike 60 may range from $2 \times 10^{17}$ atoms/cm$^3$ to $7 \times 10^{18}$ atoms/cm$^3$, and in a further example the dopant 60 spike may range from $1 \times 10^{18}$ atoms/cm$^3$ to $5 \times 10^{18}$ atoms/cm$^3$.

FIG. 4 depicts a plot of an n-type semiconductor device including a channel implant region 61 of a n-type dopant having a dopant spike 60, i.e., peak concentration, present substantially at the center C1 of the recessed channel, wherein the concentration of the channel implant region 61 decreases from the dopant spike 60 towards each end 62a, 62b of the recessed channel that abuts the raised source and the raised drain. In one embodiment, in which the semiconductor device is an n-type semiconductor having a n-type channel implant region 61, the concentration at each end 62a, 62b of the recessed channel may be $5 \times 10^{18}$ atoms/cm$^3$ less than the concentration at the dopant spike 60 that is present substantially at the center C1 of the recessed channel. In one example, the channel implant region 61 is composed of arsenic, the peak concentration at the center C1 of the recessed channel ranges from $6 \times 10^{18}$ atoms/cm$^3$ to $8 \times 10^{18}$ atoms/cm$^3$, and the concentration at each end 62a, 62b of the recessed channel ranges from $4 \times 10^{18}$ atoms/cm$^3$ to $5 \times 10^{18}$ atoms/cm$^3$. In another example, the channel implant region 60 is composed of As, the peak concentration at the center C1 of the recessed channel of the recessed channel ranges from $6.5 \times 10^{18}$ atoms/cm$^3$ to $7.5 \times 10^{18}$ atoms/cm$^3$, and the concentration at each end 62a, 62b of the recessed channel ranges from $4.5 \times 10^{18}$ atoms/cm$^3$ to $5 \times 10^{18}$ atoms/cm$^3$.

Although FIG. 4 depicts the concentration of the channel implant region 61 of an n-type semiconductor device having a n-type channel implant, the geometry of the curve depicted in FIG. 4 is similar to a plot of the concentration of the channel implant region 61 of a p-type semiconductor device having an p-type channel implant. More specifically, the p-type semiconductor device manufactured in accordance with the present invention may include a channel implant region 61 of an p-type dopant having a dopant spike 60, i.e., peak concentration, present substantially at the center C1 of the recessed channel, wherein the concentration of the channel implant region 61 decreases from the dopant spike 60 towards each end 62a, 62b of the recessed channel that abuts the raised source and the raised drain.

In one embodiment, in which the device is a p-type semiconductor having an p-type channel implant region 61, the concentration at each end 62a, 62b of the recessed channel may be $2 \times 10^{18}$ atoms/cm$^3$ less than the concentration at the dopant spike 60 that is present substantially at the center C1 of the recessed channel. In one example, in which the channel implant region 61 is composed of boron or indium, the peak concentration at the center C1 of the recessed channel ranges from $6 \times 10^{18}$ atoms/cm$^3$ to $8 \times 10^{18}$ atoms/cm$^3$, and the concentration at each end 62a, 62b of the recessed channel ranges from $4\times10^{18}$ atoms/cm$^3$ to $5\times10^{18}$ atoms/cm$^3$ In another example, in which the channel implant region 61 is composed of boron or indium, the peak concentration at the center C1 of the recessed channel ranges from $7\times10^{18}$ atoms/cm$^3$ to $8\times10^{18}$ atoms/cm$^3$, and the concentration at each end 62a, 62b of the recessed channel ranges from $4.5\times10^{18}$ atoms/cm$^3$ to $5\times10^{18}$ atoms/cm$^3$.

Figure 5:
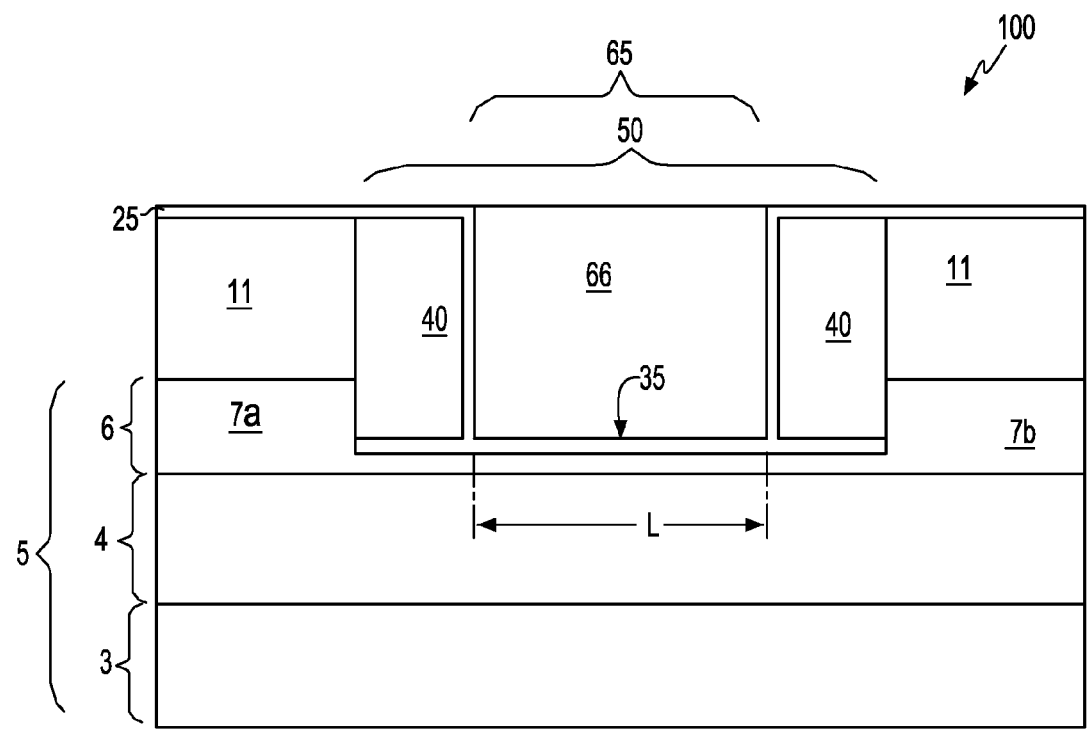
FIG. 5 is a side cross-sectional view depicting a process sequence that includes removing the offset spacer that is depicted in FIG. 3, and forming a gate structure including a metal gate conductor overlying the recessed channel.

FIG. 5 depicts one embodiment of a process sequence that includes removing the offset spacer 45 from the structure depicted in FIG. 3, and forming a gate structure 65 including a metal gate conductor 66 overlying the recessed channel 50. Removing the offset spacer 45 typically includes a selective etch process, wherein the selective etch process may also remove at least a portion of the third dielectric layer 20 without substantially damaging the underlying second dielectric layer 25. The third dielectric layer 20 may be removed using dry etch processes, including but not limited to reactive ion etch and high-density plasma etch. In one embodiment, to ensure that the third dielectric layer 20 is removed without damaging the underlying second dielectric layer 25, the etch process may be timed or monitored using end point detection methods.

Next, the gate conductor 66 is formed atop second dielectric layer 20 by a deposition process (such as CVD, plasma-assisted CVD, plating, sputtering and etc.) followed by planarization. The gate conductor 66 may comprise any conductive material including but not limited to polysilicon, a conductive elemental metal such as W, Cu, Pt, Ag, Au, Ru, Ir, Rh, and Re, alloys that include at least one of the aforementioned conductive elemental metals, silicides or nitrides that include at least one of the above-mentioned conductive elemental metals, and combinations thereof may be employed. Following deposition of the gate conductor 66, the upper surface may be planarized to be coplanar with the upper surface of the pad dielectric 11. In one example, the planarization process includes chemical mechanical planarization (CMP).

In the embodiments of the invention in which the raised source 7a and the raised drain 7b have not been doped prior to the formation of the gate structure 65, the pad dielectric 11 and the portion of the second dielectric layer 25 that is overlying the pad dielectric 11 may be removed to expose an upper surface of the raised source 7a and the raised drain 7b. Thereafter, an implantation method, such as ion implantation, may introduce p-type or n-type conductivity type dopants into the raised source 7a and the raised drain 7b.

P-type raised source 7a and raised drain 7b regions are typically produced with group III-A elements and n-type raised source 7a and raised drain 7b regions are typically produced with group V elements. In the case of the p-type implants, a typical impurity species is boron or BF$_2$. Boron with an energy of about 0.2 keV to 3.0 keV or BF$_2$ with an energy of about 1.0 keV to about 15.0 keV and a dose of about $5\times10^{13}$ atoms/cm$^2$ to about $3\times10^{16}$ atoms/cm$^2$ can be used to implant the p-type region. A typical implant for the n-type regions is arsenic. The n-type regions can be implanted with arsenic using an energy of about 0.5 keV to 5.0 keV with a dose of about $3\times10^{13}$ atoms/cm$^2$ to about $3\times10^{16}$ atoms/cm$^2$. In some embodiments, back end of the line (BEOL) processing may now be performed including, but not limited to: contact and wiring processes.

Figure 6:
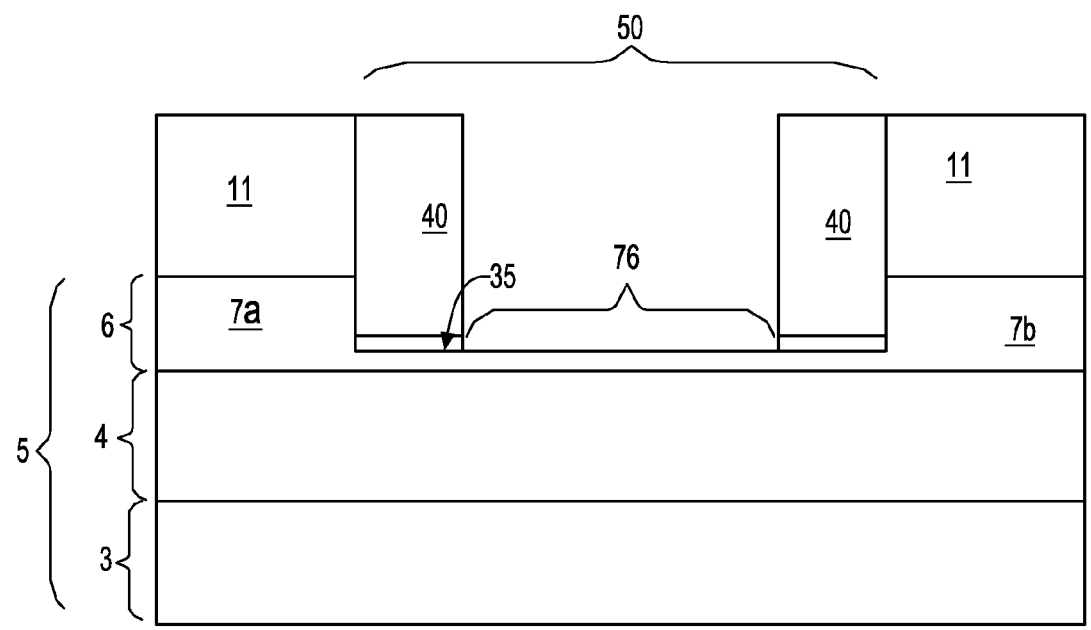
FIG. 6 is a side cross-sectional view depicting an initial structure used in a second embodiment of a method of forming a semiconductor device, in which an exposed portion of the first dielectric layer is removed to provide an exposed portion of the recessed channel region.
Figure 7:
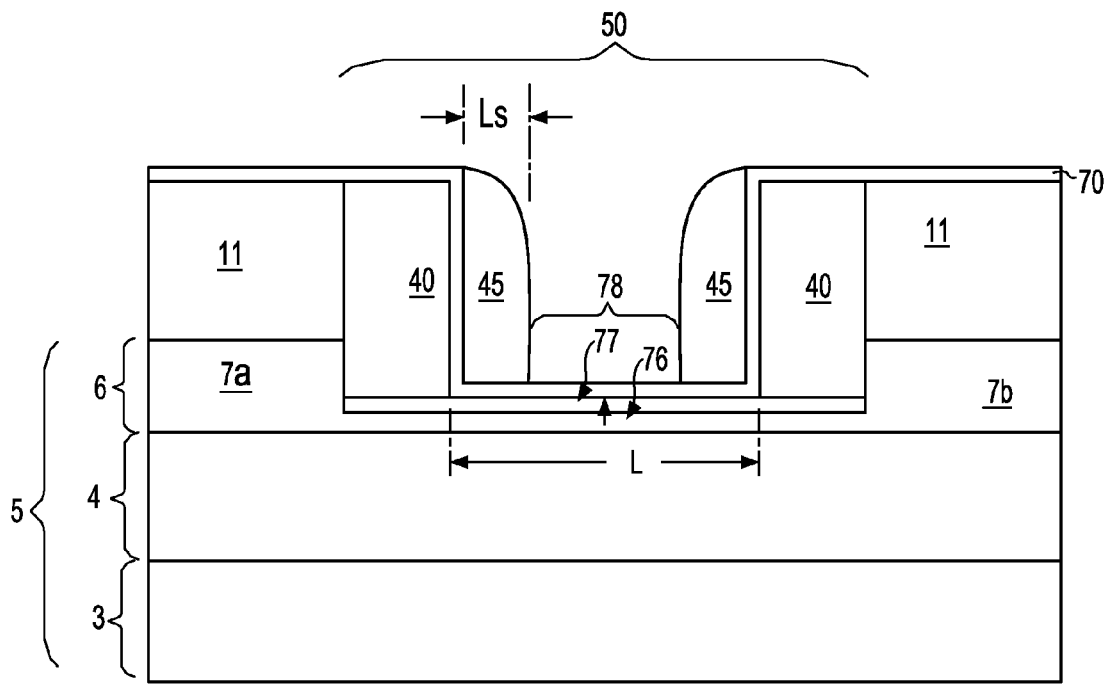
FIG. 7 is a side cross-sectional view depicting one embodiment of forming a high-k dielectric layer on the exposed portion of the recessed channel region, forming a metal layer overlying the high-k dielectric layer, and forming an offset spacer abutting the vertical surfaces of the metal layer that are abutting a sidewall of a sidewall spacer, in which a central portion of the metal layer that is not underlying the offset spacer is exposed.

FIGS. 6-7 depict another embodiment of a method of forming a semiconductor device, in which a channel implant 55 having a peak concentration, i.e., dopant spike 60, at the center C$_1$ of the recessed channel 50 that may reduce short channel effects and may enhance controllability of the semiconductor device. In this embodiment of the present invention, a metal layer 70 (depicted in FIG. 7) is used as an etch stop, wherein the metal layer 70 is substituted for the second dielectric layer 25 that is described in the embodiments of the present invention that are consistent with FIGS. 1-5.

The initial structure used in the embodiments of the present invention that utilize the above described metal layer 70 may include a semiconductor layer 6 having a raised source 7a and raised drain 7b that are separated by a recessed channel 50 having a thickness T$_1$ of less than 20 nm, similar to the initial structure that is utilized in the embodiments of the invention that are consistent with FIG. 1. The initial structure typically includes a first dielectric layer 35 that is present overlying the recessed channel 50, and sidewall spacers 40 abutting the sidewall S1 of the raised source 7a and the raised drain 7b. The above description for the initial structure, its related components and its method of manufacture as described with reference to FIG. 1 is equally applicable to the embodiments of the present invention that are described with reference to FIGS. 6 and 7.

Referring to FIG. 6, an exposed portion of the first dielectric layer 35 is removed to provide an exposed portion 76 of the recessed channel 50. Removing the exposed portion of the first dielectric layer 35 may include an etch process, such as a selective etch process, that removes the material of the first dielectric layer 35 without substantially damaging the upper surface of the recessed channel 50. Suitable methods for etching the first dielectric layer 35 include dry etch processes, including but not limited to: reactive ion etch and high-density plasma etch.

FIG. 7 depicts one embodiment of forming a high-k dielectric layer 77 overlying the exposed portion 76 of the recessed channel 50, forming a metal layer 70 overlying the high-k dielectric layer 77, and forming an offset spacer 45 abutting vertical surfaces of the metal layer 70 that are abutting a sidewall of the sidewall spacer 40, in which a central portion 78 of the metal layer 70 that is not underlying the offset spacer 45 is exposed.

The high-k dielectric layer 77 is formed using methods consistent with the second dielectric layer 25 that is described above with reference to FIG. 2, so long as the material selected for the high-k dielectric layer 77 has a dielectric constant greater than 3.9, typically being greater than 4.0, and in some instances being greater than 7.0.

The metal layer 70 may be composed of any conductive material including, but not limited to a conductive elemental metal such as W, Cu, Pt, Ag, Au, Ru, Ir, Rh, and Re; alloys that include at least one of the aforementioned conductive elemental metals; silicides or nitrides that include at least one of the above-mentioned conductive elemental metals; and combinations thereof may be employed. In one embodiment, the metal layer 70 has a thickness ranging from 3 nm to 15 nm, typically ranging from 3 nm to 10 nm, and in one example ranging from 3 nm to 7 nm. The metal layer 70 may be formed atop the high-k dielectric layer 77 using a deposition process, such as CVD, plasma-assisted CVD, plating, sputtering and etc. The description of the offset spacer 45 and its methods of formation that have been described with reference to FIG. 2 are suitable for the formation of the offset spacer 45 that is depicted in FIG. 7.

Following the formation of the offset spacer 45, the structure that is depicted in FIG. 7 may then be processed with a channel implant 55, as described in FIG. 3, as well as subsequently processed to provide a semiconductor device 100, as described in FIG. 5. It is noted that the above process sequence and structures that are described with reference to FIGS. 3-5 are suitable for the embodiments of the invention that are described with reference to FIGS. 6 and 7, so long as the high-k dielectric layer 77 is substituted for the portion of the first dielectric layer 35 that is present on the upper surface of the recessed channel 50, and the metal layer 70 is substituted for the second dielectric layer 25 and the third dielectric layer 30. In one embodiment, the metal layer 70 functions as an etch stop layer during subsequent etch processes.

It is observed that the above-described methods provide a semiconductor device 100 having a channel thickness $T_1$ on the order of 20 nm or less, and having a gate length (L) that can be scaled down to 15 nm or less, wherein controllability of the "on" and "off" states of the semiconductor device is still maintained. In one embodiment, by controllability it is meant that the device has a threshold voltage that is high enough so that the device can be switched from an "off" state to an "on" state by the purposeful application of a voltage.

Figure 8:
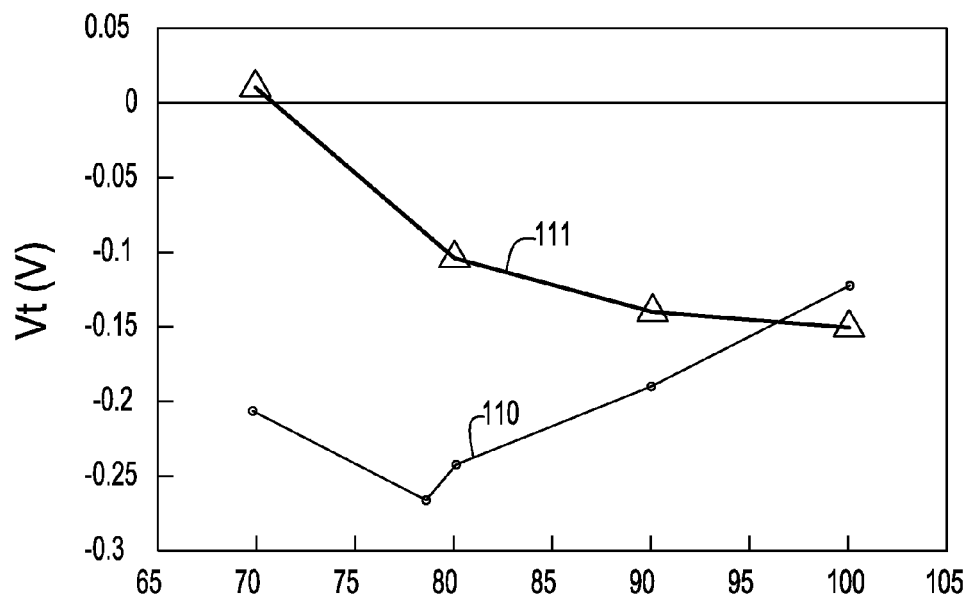
FIG. 8 is a plot of threshold voltage as a function of channel length for semiconductor devices that have been produced in accordance with the present invention, in comparison to a plot of threshold voltage as a function of channel length for semiconductor devices that do not include the channel implant.

FIG. 8 is a plot for the threshold voltage (V) as a function of channel length L (nm) for a p-type semiconductor device, e.g. pFET, having a channel implant region composed of an n-type dopant that has been prepared in accordance with the present invention, as indicated by reference line 110. The plot depicted by reference line 110 indicates that at channel lengths of less than 90 nm, the threshold voltage for a p-type semiconductor device, e.g. pFET, having a channel implant region composed of an n-type dopant processed in accordance with the methods described above with reference to FIGS. 1-7, maintains a threshold voltage of approximately −0.2 V or greater. As a comparative example, a plot for the threshold voltage as a function of channel length L for a p-type semiconductor device that does not include the channel implant region of the present invention is indicated by reference line 111. The comparative example 111 clearly depicts that without the above described channel implant region, the controllability of the device is substantially reduced for channel lengths L (i.e., $L-2L_s$) of 90 nm or less, as indicated by threshold values of −0.15 volts or less. It is noted that the above example is provided for illustrate purposes only and is not intended to limit the invention solely thereto.

For example, in one embodiment, in which the semiconductor device is a pFET device having a gate length L ranging from 20 nm to 40 nm, the threshold voltage of the semiconductor device at saturation mode may range from −0.2 V to about −0.4 V, more typically ranging from about −0.20 V to about −0.25 V. In another embodiment, in which the semiconductor device is an nFET device having a channel length L ranging from 18 nm to 38 nm, the threshold voltage of the semiconductor device may range from about 0.15 V to about 0.4 V, in one example ranging from about 0.13 V to about 0.15 V.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described the invention in detail, what we claim as new and desire to secure by Letters Patent is:

1. A method of forming a semiconductor device comprising:
   providing a semiconductor layer including a raised source and a raised drain that are separated by a recessed channel having a thickness of less than 20 nm;
   forming an offset spacer on a sidewall of the raised source and the raised drain that is atop a portion of the recessed channel;
   performing a channel implant that produces a dopant spike of opposite conductivity as the raised source and raised drain;
   removing the offset spacer; and
   forming a gate structure including a metal gate conductor on top of the recessed channel.

2. The method of claim 1, wherein a first dielectric layer is present atop the recessed channel.

3. The method of claim 2, wherein the first dielectric layer comprises a first dielectric material, the offset spacer comprises the first dielectric material, and the forming of the offset spacer abutting the sidewall of the raised source and the raised drain comprises:
   forming a sidewall spacer of a second dielectric material on the sidewall of the raised source and the raised drain and a portion of the first dielectric layer;
   forming a second dielectric layer composed of the first dielectric material atop the sidewall spacer and the first dielectric layer;
   forming a third dielectric layer composed of a second dielectric material atop the second dielectric layer; and
   forming the offset spacer abutting vertical surfaces of the third dielectric layer abutting a sidewall of the sidewall spacer, wherein a central portion of the third dielectric layer that is not beneath the offset spacer is exposed.

4. The method of claim 3, wherein the first dielectric material comprises an oxide and the second dielectric material comprises a nitride.

5. The method of claim 3, wherein a gate length is equal to a dimension separating a portion of the second dielectric layer that is present on the sidewall of the sidewall spacer from an opposing portion of the second dielectric layer that is present on an opposing sidewall of the sidewall spacer.

6. The method of claim 1, wherein the channel implantation comprises arsenic, phosphorous, boron, and indium.

7. The method of claim 3, wherein forming the gate structure comprises removing the offset spacers and a portion of the third dielectric layer, the second dielectric layer, and the first dielectric layer to expose the recessed channel.

8. The method of claim 1, wherein the gate structure comprises a high-k gate dielectric and a metal gate.

9. The method of claim 1, wherein a first dielectric layer is formed on an upper surface of the channel region prior to the formation of the offset spacers.

10. The method of claim 9, wherein the first dielectric layer comprises a first dielectric material, the offset spacer comprises the first dielectric material, and the forming of the sidewall spacer abutting the sidewall of the raised source and raised drain comprises:
    forming a sidewall spacer of a second dielectric material on the sidewall of the raised source and the raised drain and a portion of the first dielectric layer;
    removing an exposed portion of the first dielectric layer to provide an exposed portion of the recessed channel;
    forming a high-k dielectric layer on the exposed portion of the recessed channel;
    forming a metal layer overlying the high-k dielectric layer; and
    forming the offset spacer abutting vertical surfaces of the metal layer that is abutting the sidewall of the sidewall spacer, wherein a central portion of the metal layer that is not beneath the offset spacer is exposed.

11. The method of claim 10, wherein the first dielectric material comprises an oxide and the second dielectric material comprises a nitride.

12. The method of claim 1, wherein the recessed channel region has a length ranging from 40 nm to 90 nm.

13. The method of claim 1, wherein the recessed channel has a thickness ranging from 5 nm to 20 nm, and the raised source and the raised drain have a thickness ranging from 10 nm to 50 nm.

* * * * *